(12) United States Patent
Yum et al.

(10) Patent No.: US 9,921,908 B2
(45) Date of Patent: Mar. 20, 2018

(54) STORAGE DEVICE AND READ RECLAIM AND READ METHOD THEREOF

(71) Applicants: Ho-Suk Yum, Hwaseong-si (KR); Jinwan Jun, Seoul (KR)

(72) Inventors: Ho-Suk Yum, Hwaseong-si (KR); Jinwan Jun, Seoul (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 109 days.

(21) Appl. No.: 14/960,570

(22) Filed: Dec. 7, 2015

(65) Prior Publication Data

US 2016/0217032 A1    Jul. 28, 2016

(30) Foreign Application Priority Data

Jan. 23, 2015    (KR) ............... 10-2015-0011288

(51) Int. Cl.
| | |
|---|---|
| G11C 29/00 | (2006.01) |
| G06F 11/10 | (2006.01) |
| G11C 29/52 | (2006.01) |
| G11C 16/34 | (2006.01) |
| G11C 29/42 | (2006.01) |
| G11C 29/04 | (2006.01) |

(52) U.S. Cl.
CPC ...... *G06F 11/1048* (2013.01); *G11C 16/3418* (2013.01); *G11C 29/42* (2013.01); *G11C 29/52* (2013.01); *G11C 2029/0411* (2013.01)

(58) Field of Classification Search
CPC ............... G11C 29/52; G11C 16/3418; G11C 2029/0411; G11C 29/42; G06F 11/1048
See application file for complete search history.

(56) References Cited

U.S. PATENT DOCUMENTS

| | | |
|---|---|---|
| 5,896,318 A | 4/1999 | Asada et al. |
| 7,679,133 B2 | 3/2010 | Son et al. |
| 8,055,832 B2 | 11/2011 | Sinclair et al. |
| 8,553,466 B2 | 10/2013 | Han et al. |
| 8,559,235 B2 | 10/2013 | Yoon et al. |
| 8,621,266 B2 | 12/2013 | Kang et al. |
| 8,654,587 B2 | 2/2014 | Yoon et al. |
| 8,689,082 B2 | 4/2014 | Oh et al. |
| 8,707,112 B2 | 4/2014 | Roohparvar et al. |
| 2009/0172267 A1 | 7/2009 | Oribe et al. |
| 2010/0217919 A1 | 8/2010 | Sukegawa et al. |
| 2010/0235713 A1* | 9/2010 | Lee ............ G06F 11/1072 714/763 |
| 2011/0233648 A1 | 9/2011 | Seol et al. |
| 2012/0278533 A1 | 11/2012 | Suzuki et al. |
| 2013/0205075 A1 | 8/2013 | Twitto et al. |
| 2014/0075241 A1 | 3/2014 | Oh et al. |

(Continued)

FOREIGN PATENT DOCUMENTS

| | | |
|---|---|---|
| JP | 2002-318729 A | 10/2002 |
| JP | 2009-224013 A | 10/2009 |
| KR | 2014-0044640 A | 4/2014 |

*Primary Examiner* — Guy Lamarre
(74) *Attorney, Agent, or Firm* — Harness, Dickey & Pierce, P.L.C.

(57) ABSTRACT

A read reclaim method of a storage device includes determining a number of page read reclaims based on degradation information in a read operation, and performing page read reclaim when a number of pages marked as read reclaim object reaches the number of page read reclaims.

19 Claims, 17 Drawing Sheets

(56) References Cited

U.S. PATENT DOCUMENTS

| | | | |
|---|---|---|---|
| 2014/0101372 A1 | 4/2014 | Jung et al. | |
| 2014/0237165 A1* | 8/2014 | Seo | G06F 12/0246 |
| | | | 711/103 |
| 2014/0281770 A1 | 9/2014 | Kim et al. | |
| 2015/0012671 A1* | 1/2015 | Park | G06F 1/3268 |
| | | | 710/5 |
| 2016/0307635 A1* | 10/2016 | Kim | G11C 16/28 |

* cited by examiner

STORAGE DEVICE AND READ RECLAIM AND READ METHOD THEREOF

CROSS-REFERENCE TO RELATED APPLICATIONS

This U.S. non-provisional patent application claims priority under 35 U.S.C. § 119 to Korean Patent Application No. 10-2015-0011288 filed Jan. 23, 2015, the entire contents of which are hereby incorporated by reference.

BACKGROUND

Example embodiments of inventive concepts described herein relate to a storage device and read reclaim and/or read methods thereof.

Semiconductor memory devices may be classified into volatile semiconductor memory devices and nonvolatile semiconductor memory devices. The nonvolatile semiconductor memory devices may retain data stored therein even at power-off. Data stored in the nonvolatile semiconductor memory device may be permanent or reprogrammable, depending upon the fabrication technology used. The nonvolatile semiconductor memory devices may be used for user data storage and program and microcode storage in a wide variety of applications in the computer, avionics, telecommunications, and consumer electronics industries.

SUMMARY

Example embodiments of inventive concepts provide a storage device and read reclaim and read methods thereof capable of improving the reliability of data.

According to example embodiments of inventive concepts, a method of operating a storage device includes determining a number of page read reclaims based on degradation information in a read operation; and performing page read reclaim when the number of pages marked as read reclaim object reaches the number of page read reclaims.

In example embodiments, the degradation information may include a program/erase cycle value.

In example embodiments, the degradation information may further include program elapsed time information about a page.

In example embodiments, the degradation information may further include operation temperature information.

In example embodiments, the determining the number of page read reclaims based on degradation information may include determining the number of page read reclaims based on an amount of written sectors and a terabyte write unit.

In example embodiments, the determining the number of page read reclaims may include obtaining a value using a product of a weight ratio and a ratio of the amount of written sectors and the terabyte write unit.

In example embodiments, the method may further include determining whether read reclaim about a page is required, based on a result of a recovery read operation, and marking read reclaim about the page when the read reclaim is required.

According to example embodiments of inventive concepts, a method of operating a storage device includes reading page data in response a read request; determining whether the read page data includes at least one error; determining whether the read page data includes an error that is correctable using an error correction circuit (ECC) if the read page data includes the at least one error; performing a recovery read operation if the read page data includes an error that is uncorrectable using the ECC; determining whether the recovery read operation can correct the error that is uncorrectable using the ECC if the read page data includes the error that is uncorrectable using the ECC; determining whether read reclaim is required if the recovery read operation can correct error that is uncorrectable using the ECC; marking a relevant page as a read reclaim object if the read reclaim is required; performing page read reclaim if a number of pages marked as read reclaim objects reach the number of page read reclaims, changing the number of page read reclaims based on the degradation information.

In example embodiments, the determining of whether the read page data includes the error that is correctable using the ECC may include determining whether the error is correctable using the ECC, based on the number of errors detected by the ECC.

In example embodiments, the performing the recovery read operation may include adjusting one of a time and a voltage to perform a read operation according to a desired (and/or alternatively predetermined) recovery read operation table.

In example embodiments, the determining whether read reclaim is required may include determining whether read reclaim is required, based on a number of errors detected as a result of a read operation according to the recovery read operation.

In example embodiments, the read method may further include correcting the error that is uncorrectable using the ECC after marking the relevant page if the read page data includes the error that is uncorrectable using the ECC and the error that is uncorrectable using the ECC can be corrected by the recovery read operation.

In example embodiments, the degradation information may include a program/erase cycle value, and wherein the number of page read reclaims is changed when a value of the program/erase cycle exceeds a desired (and/or alternatively predetermined) value.

In example embodiments, the degradation information may include at least one of a program/erase cycle value, a program elapsed time, and an operation temperature.

According to example embodiments of inventive concepts, a storage device includes a plurality of nonvolatile memory devices and a memory controller configured to control the nonvolatile memory devices. The memory controller may include a dynamic read reclaim managing unit configured to change a number of pages processed at read reclaim based on degradation information.

In example embodiments, the nonvolatile memory devices may include memory blocks. The memory blocks may include the pages. The memory controller may be configured to manage whether or not of read pages included in each of memory blocks are processed at the read reclaim.

In example embodiments, the dynamic read reclaim managing unit may be configured to manage page read reclaim based on an index using a program/erase cycle value directly or indirectly.

In example embodiments, the memory controller may further include an error correction circuit configured to at least one of detect and correct an error of data read from the nonvolatile memory devices.

In example embodiments, the memory controller may be configured to perform a recovery read operation for changing a read operation condition using a table if an error detected through the error correction circuit is uncorrectable and again perform the read operation using the changed read operation condition. The recovery read operation may be implemented by firmware.

In example embodiments, each of the nonvolatile memory devices may be a vertical NAND flash memory device.

According to example embodiments, a method of operating a storage device includes determining a reference value using degradation information, the reference value corresponding to a number of pages processed during a page read reclaim operation; performing a recovery read operation on one or more pages; marking a relevant page among the one or more pages as a read reclaim object based on a result of the recovery read operation if the relevant page includes a correctable error after the recovery read operation; and performing the read reclaim operation if a number of pages marked as reclaim object among the one or more pages is greater than or equal to the reference value.

In example embodiments, the method may further include reading data from the relevant page in response to a read request before performing the recovery read operation; determining whether the read page data from the relevant page includes at least one of an error of a first type, an error of a second type, and an error of a third type; correcting each error of the second type in the read page data if the relevant pages includes the error of the second type and does not include the error of the third type.

In example embodiments, the recovery read operation may include adjusting one of a time and a voltage to perform a read operation on the relevant page according to a recovery read operation table.

In example embodiments, the determining the reference value using degradation information may include obtaining a value using a product of a weight value and a ratio of an amount of written sectors to a terabyte write unit.

In example embodiments, the degradation information may include a program/erase cycle value.

BRIEF DESCRIPTION OF THE FIGURES

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
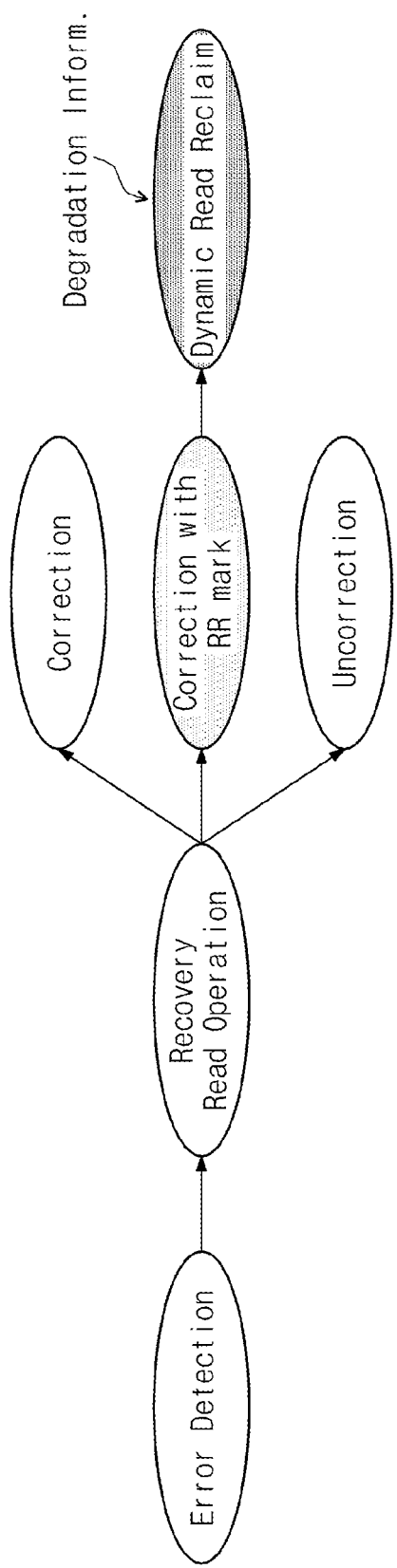
FIG. 1 is a diagram for describing dynamic read reclaim based on degradation information according to example embodiments of inventive concepts.

Example embodiments will be described in detail with reference to the accompanying drawings. Inventive concept, however, may be embodied in various different forms, and should not be construed as being limited only to the illustrated embodiments. Rather, these embodiments are provided as examples so that this disclosure will be thorough and complete, and will fully convey the scope of inventive concepts to those skilled in the art. Accordingly, known processes, elements, and techniques are not described with respect to some of the example embodiments of inventive concepts. Unless otherwise noted, like reference numerals denote like elements throughout the attached drawings and written description, and thus descriptions will not be repeated. In the drawings, the sizes and relative sizes of layers and regions may be exaggerated for clarity. Like reference characters and/or numerals in the drawings denote like elements, and thus their description may not be repeated.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration. Expressions such as "at least one of," when preceding a list of elements, modify the entire list of elements and do not modify the individual elements of the list.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

Unless otherwise defined, all terms (including technical and scientific terms) used herein have the same meaning as commonly understood by one of ordinary skill in the art to which example embodiments of inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a diagram for describing dynamic read reclaim based on degradation information according to example embodiments of inventive concepts.

In general, there may be determined whether data read in a read operation is erroneous. When an error exists, it may be corrected using an Error Correction Code (ECC). In contrast, in some cases, it may be impossible to correct the error using the ECC. To this end, a recovery read operation may be carried out using various methods.

A result of the recovery read operation may be classified into largely three states. A first state may be a state where an error can be corrected using the recovery read operation. A second state may be a state where even though an error is corrected using the recovery read operation, it is marked as "read reclaim" object indicating that the error becomes an uncorrectable error within a desired (and/or alternatively predetermined) time. A third state may be a state where it is impossible to correct an error using the recovery read operation. The read reclaim may mean moving of read error-corrected data to other physical page.

In particular, the read reclaim in example embodiments of inventive concepts may be performed based on degradation information. Here, the degradation information may include a program/erase (P/E) cycle, an erase count, a program count, a read count, a wear-level count, an elapsed time, an operation temperature, etc. According to example embodiments, the read reclaim may change/vary/control/adjust a reference value based on the degradation information. According to example embodiments, the read reclaim may change/vary/control/adjust the number of pages to be simultaneously reclaimed based on the degradation information. As a degradation level becomes higher, the number of pages to be processed at page read reclaim may increase.

Figure 2:
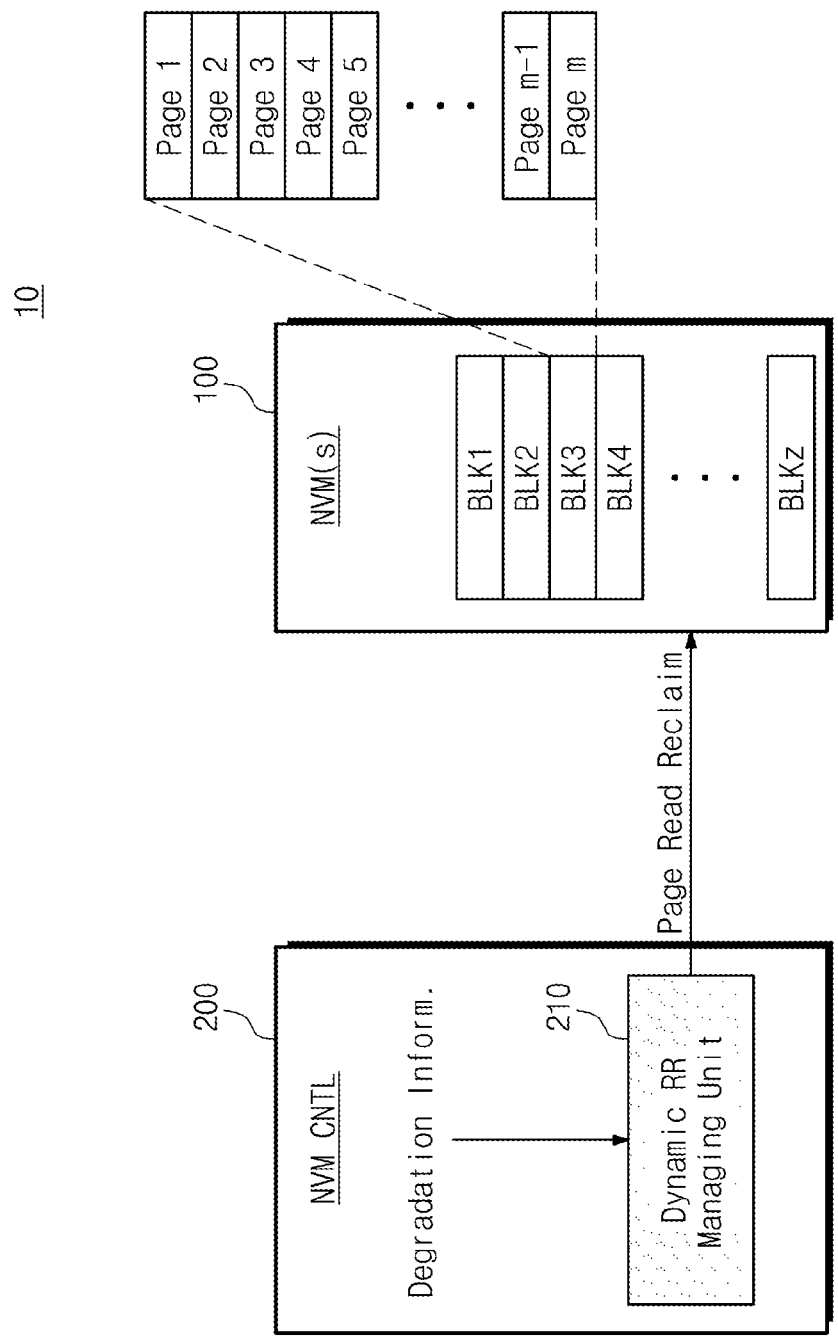
FIG. 2 is a block diagram schematically illustrating a storage device according to example embodiments of inventive concepts.

FIG. 2 is a block diagram schematically illustrating a storage device 10 according to example embodiments of inventive concepts. Referring to FIG. 2, a storage device 10 may contain at least one nonvolatile memory device 100 and a memory controller 200 to control the nonvolatile memory device 100. The storage device 10 may be a storage medium for storing user data. For example, the storage device 10 may include a Solid State Drive (SSD), an embedded MultiMedia Card (eMMC), a memory card (CF, SD, microSD, miniSD, etc.) a Universal Serial Bus (USB) memory, etc.

According to example embodiments, the nonvolatile memory device 100 may be a NAND flash memory, a vertical NAND flash memory (VNAND), a NOR flash memory, a Resistive Random Access Memory (RRAM), a Phase-Change Memory (PRAM), a Magnetoresistive Random Access Memory (MRAM), a Ferroelectric Random Access Memory (FRAM), a Spin Transfer Torque Random Access Memory (STT-RAM), etc. Also, the nonvolatile memory device 100 may be implemented to have a three-dimensional array structure.

According to example embodiments, a three-dimensional memory array may be monolithically formed at one or more physical levels of arrays of memory cells having a silicon substrate and an active region disposed on a circuit associated with operations of the memory cells. The circuit associated with operations of the memory cells may be placed in or on a substrate. The term "monolithically" may mean that layers of each level of a three-dimensional array are deposited directly on layers of a lower level of the three-dimensional array.

According to example embodiments of inventive concepts, the three-dimensional memory array may include vertical NAND strings in which at least one memory cell is placed on another memory cell due to its vertical directivity. At least one memory cell may include a charge trap layer. Each vertical NAND string may include at least one selection transistor placed on memory cells. The at least one selection transistor may be formed monolithically together with memory cells and may have the same structure as the memory cells.

A configuration suitable for a three-dimensional memory array that is formed of a plurality of levels and includes word lines or bit lines shared between levels is disclosed in U.S. Pat. Nos. 7,679,133, 8,553,466, 8,654,587, and 8,559,235 and U.S. Patent Publication No. 2011/0233648, the entire contents of which are hereby incorporated by reference.

Example embodiments of inventive concepts may be embodied using a Charge Trap Flash (CTF) where a charge storage layer is formed of an insulation layer, as well as a flash memory device where a charge storage layer is formed of a conductive floating gate.

The nonvolatile memory device 100 may include a plurality of memory blocks BLK1 to BLKz (z being an integer of 2 or more), each of which includes a plurality of pages Page 1 to Page m (m being an integer of 2 or more). Each page may be formed of a plurality of memory cells. Each of the memory cells may store at least one bit.

The memory controller 200 may include a dynamic read reclaim (RR) managing unit 210. The dynamic read reclaim managing unit 210 may control page read reclaim based on degradation information in a read operation. According to example embodiments, the dynamic read reclaim managing unit 210 may adjust the number of pages to be processed at the page read reclaim, based on the degradation information. For example, when a value of a P/E cycle is smaller than a reference value, the number of pages to be processed at the page read reclaim may be "1". In example embodiments, when a value of the P/E cycle is greater than or equal to the reference value, the number of pages to be processed at the page read reclaim may be "4". According to example embodiments, the dynamic read reclaim managing unit 210 may be implemented by software, hardware, firmware, and/or combinations thereof.

The storage device 10 according to example embodiments of inventive concepts may change the number of pages to be processed at the read reclaim, based on degradation information.

Figure 3:
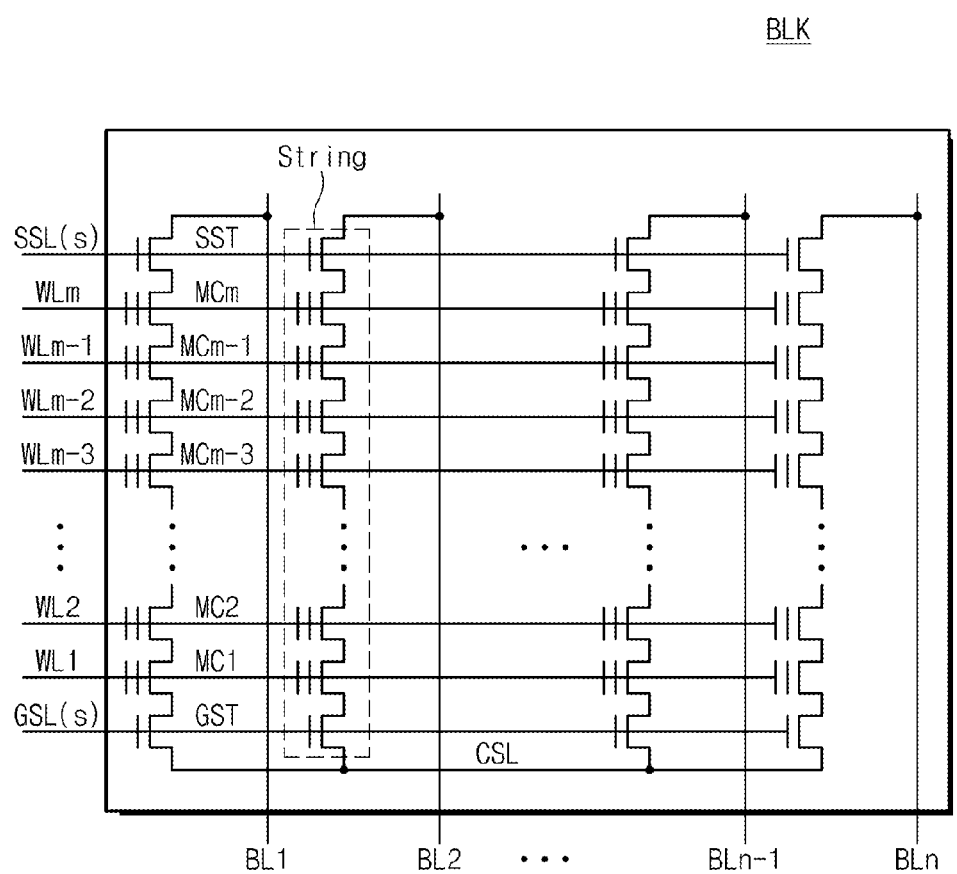
FIG. 3 is a circuit diagram schematically illustrating a memory block according to example embodiments of inventive concepts.

FIG. 3 is a circuit diagram schematically illustrating a memory block BLK according to example embodiments of inventive concepts. Referring to FIG. 3, a memory block BLK may include strings respectively connected to a plurality of bit lines BL1 to BLn (n being an integer of 2 or more). Here, each of the strings may contain at least one string selection transistor SST, a plurality of memory cells MC1 to MCm (m being an integer of 2 or more), and at least one ground selection transistor GST connected in series between a bit line and a common source line CSL. Each of the memory cells MC1 to MCm may store at least one or more bits. Though not shown, each string may further include at least one dummy cell between the string selection transistor SST and the memory cells MC1 to MCm and at least one dummy cell between the memory cells MC1 to MCm and the ground selection transistor GST. Ground selection lines GSL, word lines WL1 to WLm, and string selection lines SSL may be connected to the ground selection transistor GST, memory cells MC1 to MCm, and string selection transistors SST of different strings.

Figure 4:
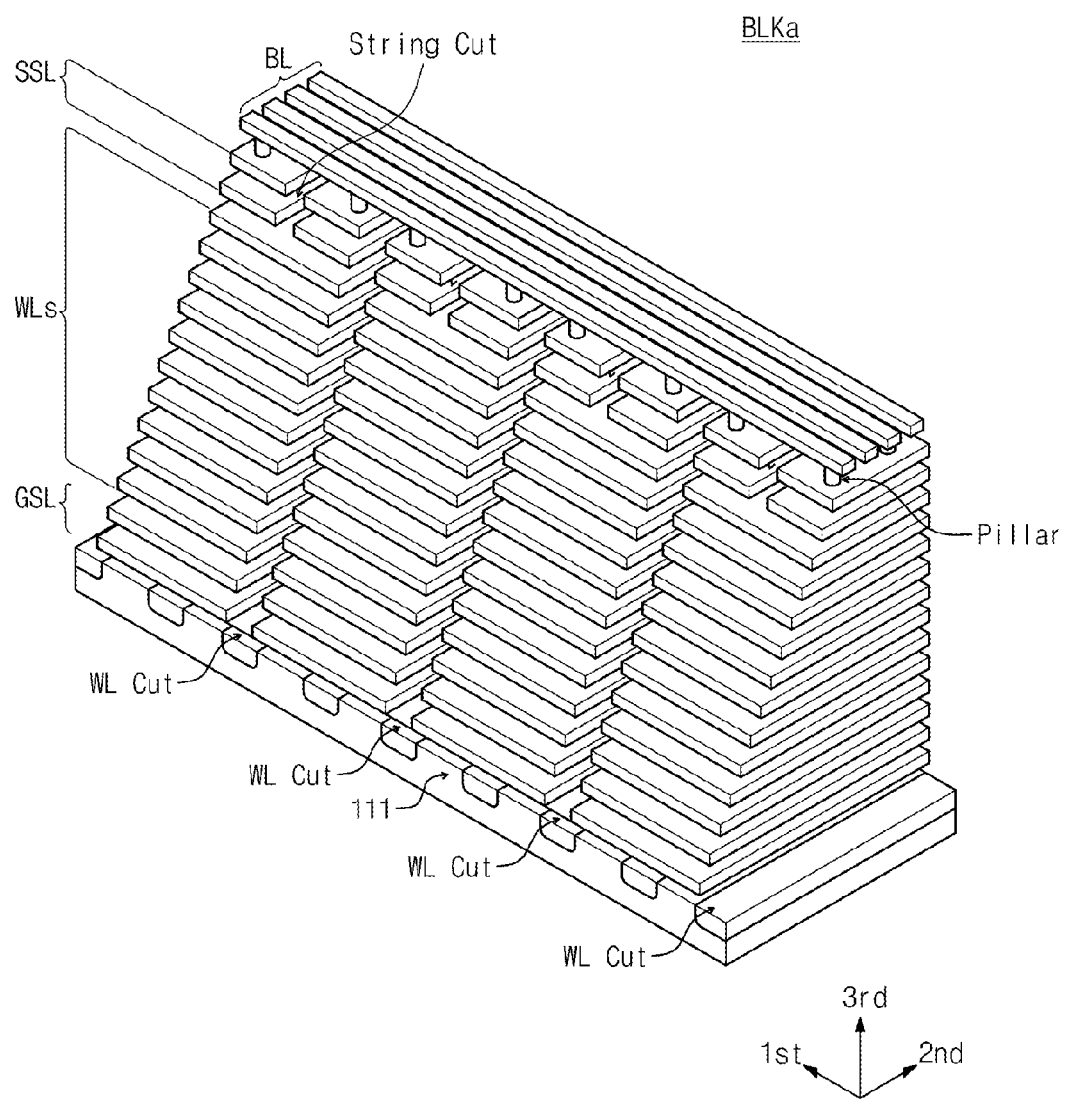
FIG. 4 is a diagram schematically illustrating a memory block according to example embodiments of inventive concepts.

FIG. 4 is a diagram schematically illustrating a memory block BLKa according to example embodiments of inventive concepts. Referring to FIG. 4, four sub blocks are formed on a substrate. The sub blocks may be formed by stacking and cutting at least one ground selection line GSL, a plurality of word lines WLs, and at least one string selection line SSL on the substrate in a plate shape. Here, the at least one string selection line SSL may be separated by string selection line cuts. Meanwhile, a block BLKa shown in FIG. 4 may include string cuts SSL_Cut. However, example embodiments are not limited thereto. The block BLKa can be implemented to have a structure that does not include a string selection line cut.

In example embodiments, at least one plate-shaped dummy word line may be formed between the ground selection line GSL and the word lines. Alternatively, at least one plate-shaped dummy word line may be formed between the word lines WLs and the string selection line SSL.

Each word line cut, although not shown in FIG. 4, may include a common source line CSL. In example embodiments, the common source lines CSL included in the word line cuts may be interconnected. A string may be formed by making a pillar connected to a bit line penetrate the at least one string selection line SSL, the word lines, and the at least one ground selection line GSL.

In FIG. 4, example embodiments of inventive concepts is embodied as a non-limiting example where a structure between word line cuts adjacent to each other is a sub block. However, inventive concepts are not limited thereto. For example, a structure between a word line cut and a string selection line cut may be defined as a sub block.

The memory block BLKa according to example embodiments of inventive concepts may be implemented to have a merged word line structure where two word lines are merged to one.

Figure 5:
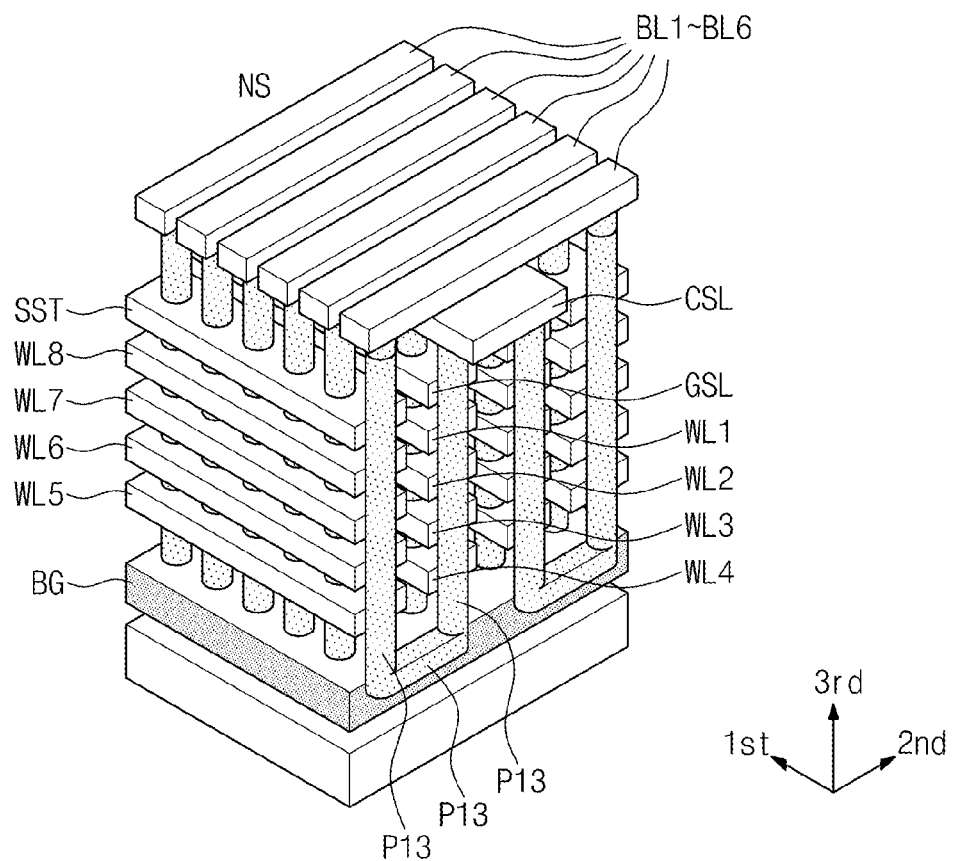
FIG. 5 is a diagram schematically illustrating a memory block according to example embodiments of inventive concepts.

FIG. 5 is a diagram schematically illustrating a memory block according to example embodiments of inventive concepts. For the sake of easy understanding, an example is described where the number of word line layers is 4, but inventive concepts are not limited thereto. Referring to FIG. 5, a memory block BLKb may be implemented to have a PBiCS (pipe-shaped bit cost scalable) structure in which lower ends of adjacent memory cells connected in series are connected through pipes. A memory block contains m-by-n strings NS (n and m being a natural number).

In FIG. 5, an example where m=6 and n=2 is described, but inventive concepts are not limited thereto. Each string NS may contain memory cells MC1 through MC8 that are connected in series. First upper ends of the memory cells MC1 through MC8 may be connected to string selection transistors SST, second upper ends thereof may be connected to ground selection transistors GST, and lower ends thereof may be connected through pipes.

In each string NS, memory cells may be formed to be stacked on a plurality of semiconductor layers. Each string NS may contain a first pillar P11, a second pillar P12, and a pillar connection portion P13 connecting the first and second pillars P11 and P12. The first pillar P11 may be connected to a bit line (e.g., BL1) and the pillar connection portion P13. The first pillar P11 may be formed to penetrate a string selection line SSL and word lines WL5 through WL8. The second pillar P12 may be connected to a common source line CSL and the pillar connection portion P13. The second pillar P12 may be formed to penetrate a ground selection line GSL and word lines WL1 through WL4. As illustrated in FIG. 5, each string NS may be formed with a U-shaped pillar.

In example embodiments, a back-gate BG may be formed on a substrate, and the pillar connection portion P13 may be embedded in the back-gate BG. In example embodiments, the back-gate BG may be used in common in the block BLKb. The back-gate BG may be separated from a back-gate of another block.

Hereinafter, a non-limiting example is described where a P/E cycle is used as degradation information.

Figure 6:
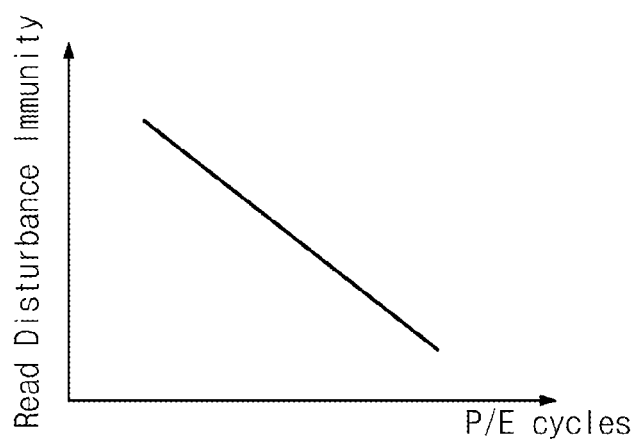
FIG. 6 is a diagram schematically illustrating a relationship between degradation information and read disturbance immunity.

FIG. 6 is a diagram schematically illustrating a relationship between degradation information and read disturbance immunity. Referring to FIG. 6, read disturbance immunity may decrease as a P/E cycle increases.

Figure 7:
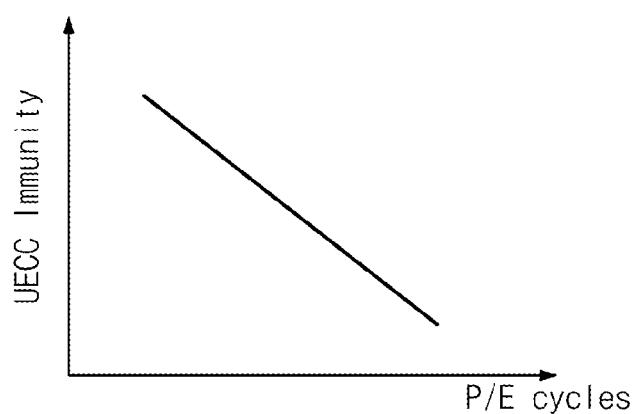
FIG. 7 is a diagram schematically illustrating a relationship between degradation information and uncorrectable ECC immunity.

FIG. 7 is a diagram schematically illustrating a relationship between degradation information and uncorrectable ECC immunity. Referring to FIG. 7, uncorrectable ECC immunity may decrease as a P/E cycle increases.

Meanwhile, referring to FIGS. 6 and 7, it is understood that occurrence probability of read disturbance and uncorrectable ECC probability increase as a P/E cycle increases. Accordingly, performing page read reclaim as soon as possible before an uncorrectable ECC state occurs may improve the reliability of stored data.

Figure 8:
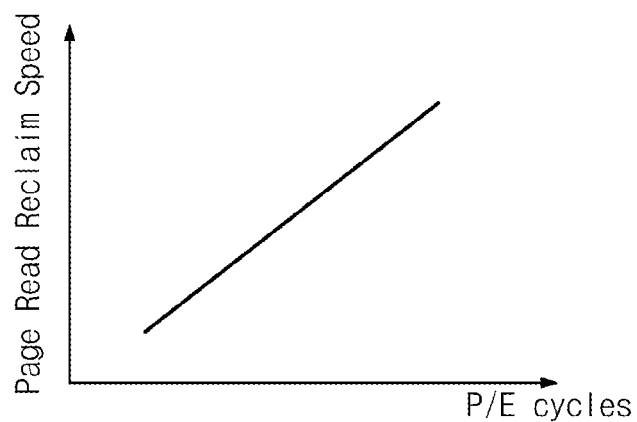
FIG. 8 is a diagram schematically illustrating a page read reclaim speed according to degradation information to improve the reliability of data of a storage device according to example embodiments of inventive concepts.

FIG. 8 is a diagram schematically illustrating a page read reclaim speed according to degradation information to improve the reliability of data of a storage device 10 according to example embodiments of inventive concepts. Referring to FIG. 8, a page read reclaim speed may increase as a P/E cycle increases. That is, as the P/E cycle increases, the number of pages to be processed at the page read reclaim may increase.

Figure 9:
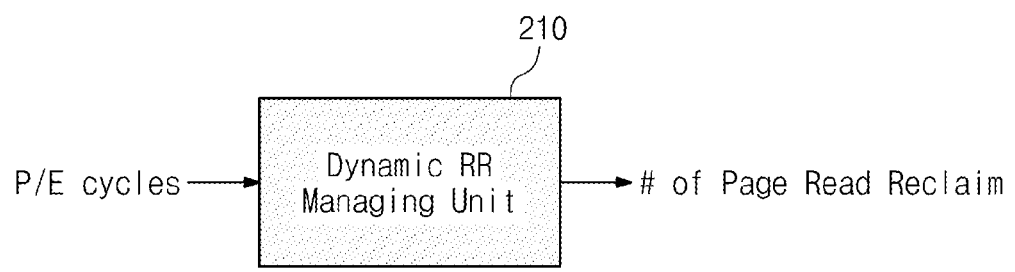
FIG. 9 is a diagram for describing an operation of a dynamic read reclaim managing unit according to example embodiments of inventive concepts.

FIG. 9 is a diagram for describing an operation of a dynamic read reclaim managing unit 210 according to example embodiments of inventive concepts. Referring to FIG. 9, a dynamic read reclaim managing unit 210 may determine the number of pages, to which page read reclaim is to be applied, based on a P/E cycle. Also, if the number of pages marked as "read reclaim" reaches a desired (and/or alternatively predetermined) number, the dynamic read reclaim managing unit 210 may allow a nonvolatile memory device 100 to perform read reclaim.

In FIG. 9, an example is described where the number of pages to which read reclaim is to be applied is determined only using a P/E cycle. However, inventive concepts are not limited thereto. A storage device 10 according to example embodiments of inventive concepts can use time information to determine the number of pages to which read reclaim is to be applied.

Figure 10:
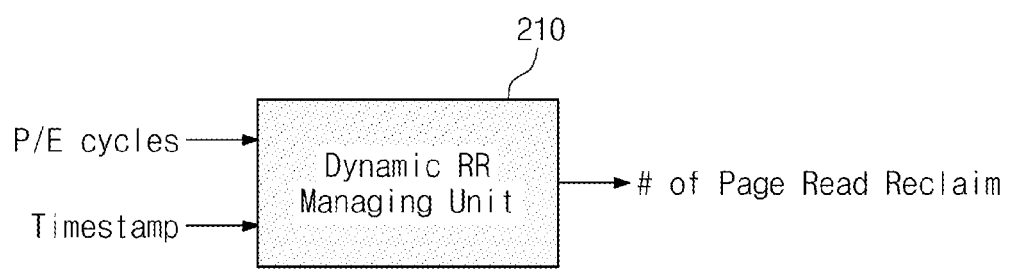
FIG. 10 is a diagram for describing an operation of a dynamic read reclaim managing unit according to example embodiments of inventive concepts.

FIG. 10 is a diagram for describing an operation of a dynamic read reclaim managing unit 210 according to example embodiments of inventive concepts. Referring to FIG. 10, a dynamic read reclaim managing unit 210 may determine the number of pages, to which page read reclaim is to be applied, based on a P/E cycle and time information.

Here, the time information may be obtained using a time stamp table. For example, it may be possible to select the number of pages, to which page read reclaim is simultaneously to be applied, using a P/E cycle and a program elapsed time between a current time and a page-programmed time (or time stamp table information).

A storage device 100 according to example embodiments of inventive concepts can use temperature information to determine the number of pages to which read reclaim is to be applied.

Figure 11:
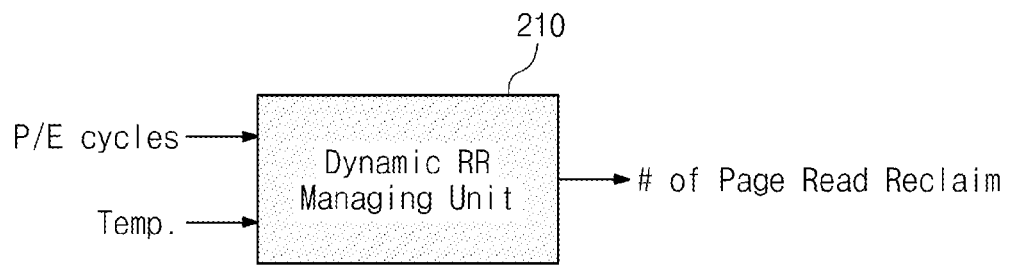
FIG. 11 is a diagram for describing an operation of a dynamic read reclaim managing unit according to example embodiments of inventive concepts.

FIG. 11 is a diagram for describing an operation of a dynamic read reclaim managing unit 210 according to example embodiments of inventive concepts. Referring to FIG. 11, a dynamic read reclaim managing unit 210 may determine the number of pages, to which page read reclaim is to be applied, based on a P/E cycle and temperature information.

In FIGS. 9 to 11, example embodiments of inventive concepts are described where dynamic read reclaim is managed using a P/E cycle directly. However, inventive concepts are not limited thereto. A dynamic read reclaim managing unit 210 according to example embodiments of inventive concepts can manage read reclaim based on an index using a P/E cycle indirectly.

Figure 12:
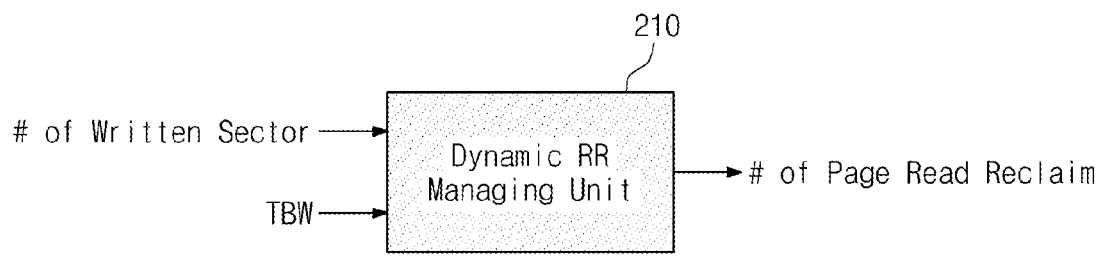
FIG. 12 is a diagram for describing an operation of a dynamic read reclaim managing unit according to example embodiments of inventive concepts.

FIG. 12 is a diagram for describing an operation of a dynamic read reclaim managing unit 210 according to example embodiments of inventive concepts. Referring to FIG. 12, a dynamic read reclaim managing unit 210 may determine the number of pages, to which page read reclaim is to be applied, using TBW (terabyte written) information and written information.

In general, the TBW may be an index indicating endurance and may be expressed by the following equation 1.

$$TBW = \frac{\text{Capacity} \times \text{P/E cycles}}{WAF} \quad \text{[Equation 1]}$$

Here, "Capacity" may indicate a capacity of a storage device, and "WAF" may indicate may be a value obtained by dividing a capacity written to the storage device by a capacity written from a host and may be expressed by the following equation 2.

$$WAF = \frac{\text{Bytes written to Storage}}{\text{Bytes written from Host}} \quad \text{[Equation 2]}$$

Returning to the equation 1, "TBW" may include a P/E cycle factor. According to example embodiments, TBW information may be a TBW unit managed on a storage device 10. For example, the TBW unit may be 0.5 terabytes (TB).

Accordingly, the number of pages to be read reclaimed may be expressed by the following equation 3.

$$\text{\# of Page Read Reclaim} = \left\lfloor \alpha \frac{\text{Written Sector}}{TWB\,\text{Unit}} + 1 \right\rfloor \quad \text{[Equation 3]}$$

Here, "a" may be a weight value, and "⌊ ⌋" may be a floor function. Referring to the equation 3, the number of pages to which page read reclaim is to be applied may be determined according to a value obtained by dividing a written sector by the TBW Unit.

Figure 13:
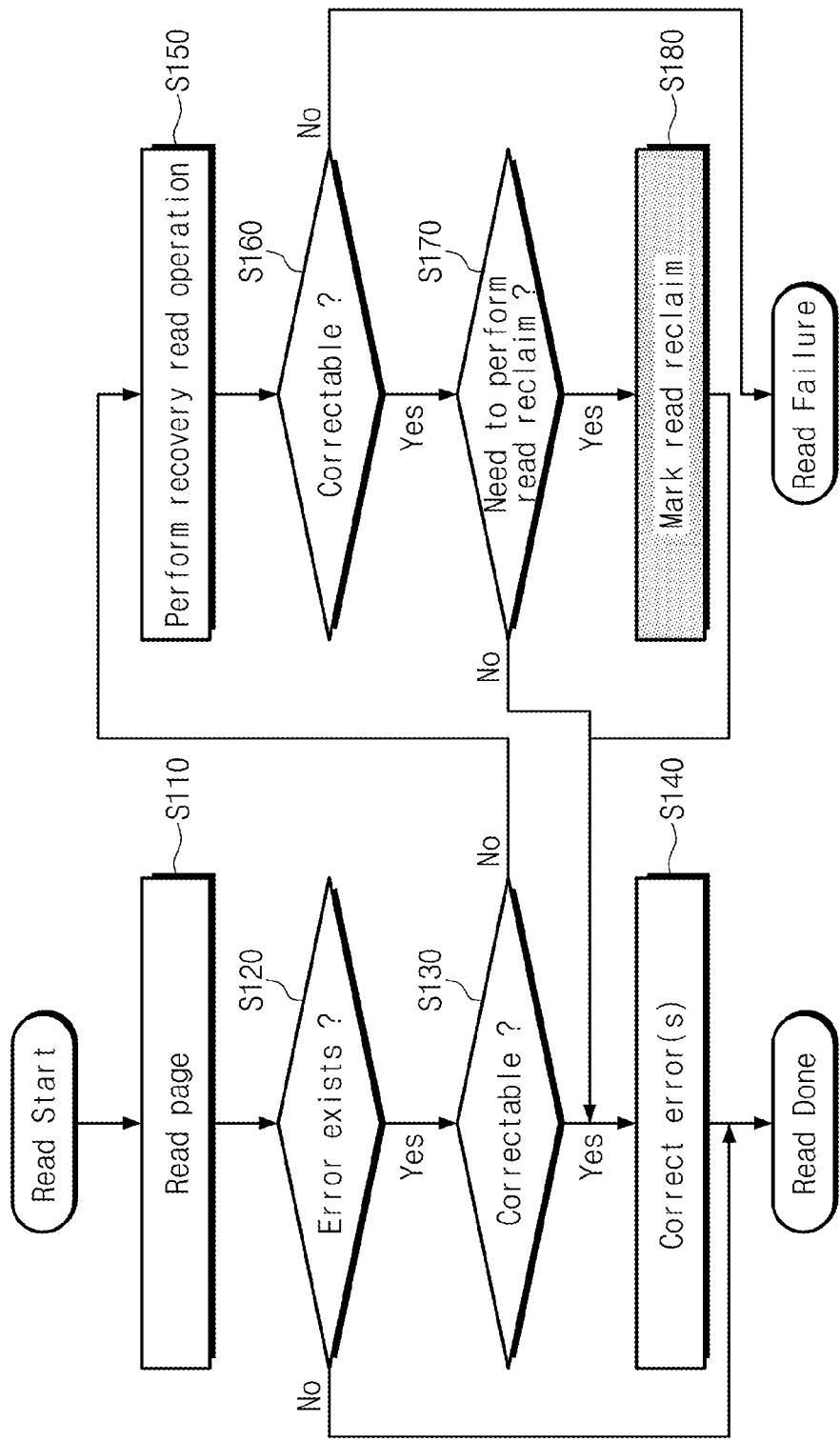
FIG. 13 is a flow chart schematically illustrating a read method of a storage device according to example embodiments of inventive concepts.

FIG. 13 is a flow chart schematically illustrating a read method of a storage device according to example embodiments of inventive concepts. A read method according to example embodiments of inventive concepts will be more fully described with reference to FIGS. 1 to 13.

In operation S110, a page may be read according to a read request. In operation S120, an ECC circuit of a memory controller 200 may determine whether read page data includes an error. As a consequence of determining that read page data does not include an error, the read data may be output to the outside and the read method may end. As a consequence of determining that read page data includes an error, in operation S130, whether the error is correctable may be determined. Here, whether the error is correctable may be determined by the ECC circuit may be based on whether the error includes correctable errors of which the number exceeds a correctable error number. In operation S130, the errors that cannot be corrected using the ECC circuit may be described as errors of a first type.

If the read data is correctable, in operation S140, the ECC circuit may correct an error of the read data and may output the corrected data to the outside. In contrast, when the read data is uncorrectable, in operation S150, a recovery read operation may be carried out. The recovery read operation may include operations of changing a read operation condition (a time, a read voltage, etc.) using a desired (and/or alternatively predetermined) read reclaim operation table and again reading a page corresponding to the read request using the changed read operation condition.

When a result of the recovery read operation indicates that read data does not include an error, the read method may end. In contrast, when a result of the recovery read operation indicates that read data includes an error, in operation S160, whether the read data is correctable may be determined. The event that a result of the recovery read operation indicates that read data is uncorrectable may be regarded as fail. In contrast, when a result of the recovery read operation indicates that read data is correctable, in operation S170, whether to perform read reclaim may be determined. For example, in the event that a result of the recovery read operation indicates that read data is correctable but the number of bits of the error exceeds a desired (and/or alternatively predetermined) value, in S180, a relevant page may be determined as not needing read reclaim and may be marked as "read reclaim" object. When the read reclaim is unnecessary or marking of read reclaim is ended, the read method proceeds to operation S140. In operation S170, errors that may be corrected using the read reclaim may be described as errors of a second type and error that cannot be corrected using the read reclaim may be described as errors of a third type.

A read operation of a storage device 10 according to example embodiments of inventive concepts may perform read reclaim marking as a result of a recovery read operation.

Figure 14:
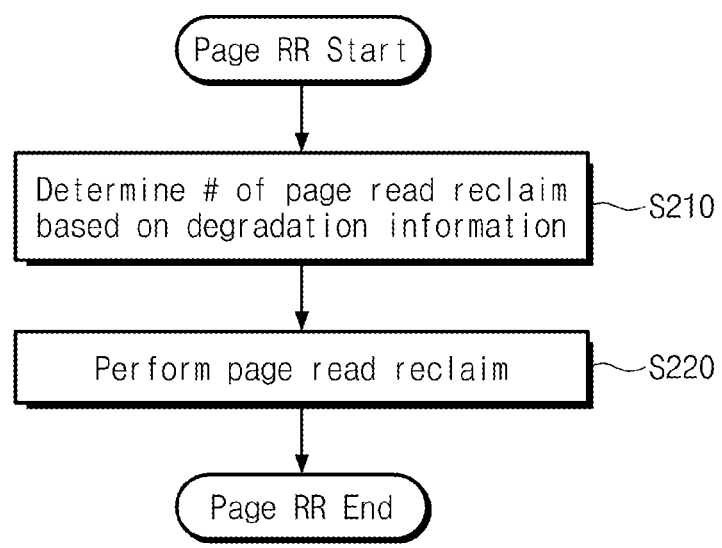
FIG. 14 is a flow chart schematically illustrating a read recovery method of a storage device according to example embodiments of inventive concepts.

FIG. 14 is a flow chart schematically illustrating a read recovery method of a storage device according to example embodiments of inventive concepts. A read reclaim method of a storage device 10 will be more fully described with reference to FIGS. 1 to 14.

In operation S210, a dynamic read reclaim managing unit 210 may determine the number of page read reclaims based on degradation information. Here, the number of page read reclaims may be the number of pages to be simultaneously processed at read reclaim. As described with reference to FIG. 13, when the number of pages marked as needing the read reclaim exceeds the number of page read reclaims, in operation S220, the page read reclaim operation may be performed.

A read reclaim method of a storage device 10 according to example embodiments of inventive concepts may change the number of page read reclaims based on degradation information.

Figure 15:
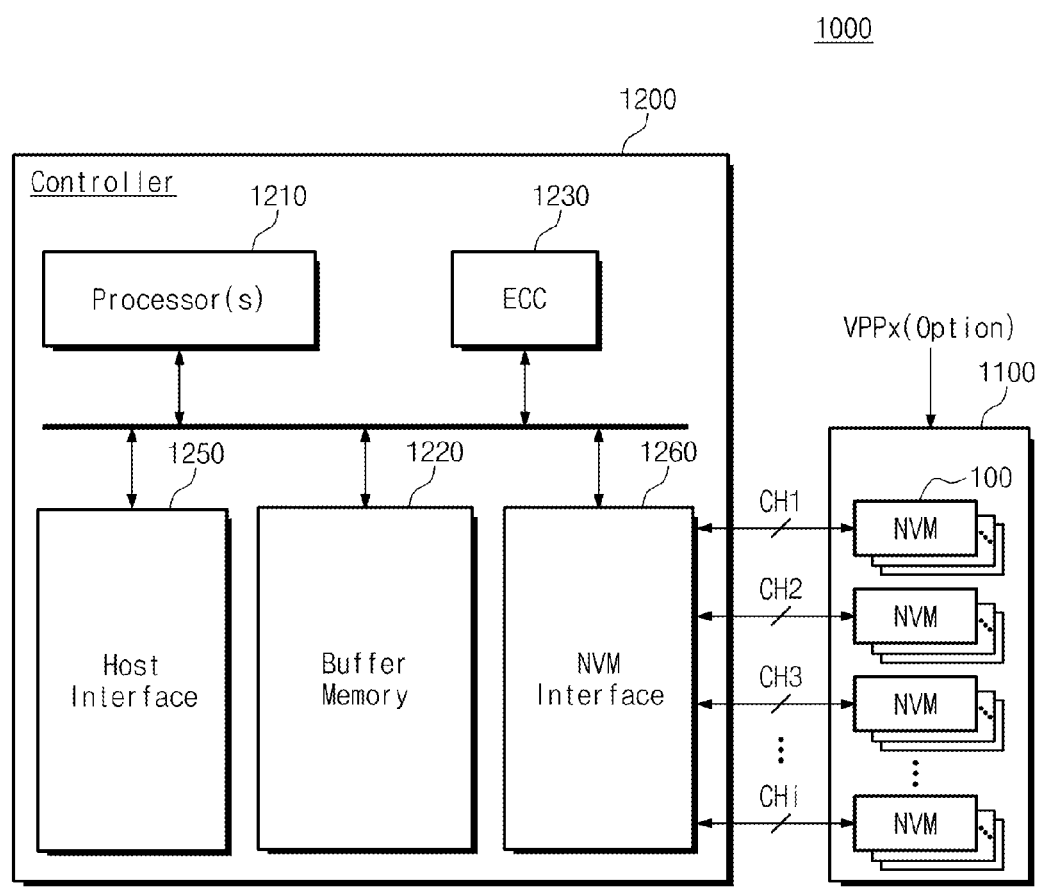
FIG. 15 is a block diagram schematically illustrating a solid state drive according to example embodiments of inventive concepts.

Example embodiments of inventive concepts may be applicable to a solid state drive (SSD). FIG. 15 is a block diagram schematically illustrating a solid state drive according to example embodiments of inventive concepts. Referring to FIG. 15, a solid state drive (hereinafter referred to as "SSD") 1000 may include a plurality of nonvolatile memory devices 1100 and an SSD controller 1200.

The nonvolatile memory devices 1100 may be implemented to be provided with an external high voltage VPPx optionally. Each of the nonvolatile memory devices 1100 may be implemented with a nonvolatile memory device 100 described with reference to FIG. 2.

The SSD controller 1200 may be connected to the nonvolatile memory devices 1100 through a plurality of channels CH1 through CHi (i being an integer of 2 or more). The SSD controller 1200 may be implemented with a memory controller described with reference to FIG. 2.

The SSD controller 1200 may contain one or more processors 1210, a buffer memory 1220, an ECC block 1230, a host interface 1250, and a nonvolatile memory interface 1260.

The buffer memory 1220 may temporarily store data used to drive the SSD controller 1200. In example embodiments, the buffer memory 1220 may include a plurality of memory lines each of which stores data or a command. Here, the memory lines may be mapped onto cache lines according to various methods. In FIG. 15, the buffer memory 1220 may be placed in the memory controller 1200. However, inventive concepts are not limited thereto. For example, the buffer memory 1220 can be placed outside the memory controller 1200.

The ECC block 1230 may calculate an ECC value of data to be programmed at a write operation, may correct an error of read data according to an ECC value in a read operation, and may correct an error of data restored from the nonvolatile memory device 1100 at a data restoration operation.

The ECC block 1230 may generate error correction codes (ECCs) for correcting a fail bit(s) or an error bit(s) of data received from the nonvolatile memory device 1100. The ECC block 1230 may generate data to which a parity bit(s) is added, by performing error correction encoding about data to be provided to the nonvolatile memory device 1100. The parity bit(s) may be stored at the nonvolatile memory device 1100. Also, the ECC block 1230 may perform error correction decoding about data output from the nonvolatile memory device 1100. The ECC block 1230 may correct an error(s) using parity information. The ECC block 1230 may correct an error(s) using an LDPC (Low Density Parity Check) code, a BCH code, a turbo code, a Reed-Solomon (RS) code, a convolution code, an RSC (Recursive Systematic Code), a TCM (Trellis-Coded Modulation), a BCM (Block coded modulation), etc.

Though not shown, a code memory may be further included which stores code data used to operate the memory controller 1200. The code memory may be implemented with a nonvolatile memory device.

The host interface 1250 may provide an interface with an external device. The host interface 1250 may be connected with the host through a PATA (Parallel AT Attachment) bus, a SATA (Serial ATA) bus, a CSI, a USB, a PCIe, an SD, an SAS, a UFS, a NAND interface, etc.

The nonvolatile memory interface 1260 may provide an interface with the nonvolatile memory devices 1100.

Though not shown, the memory controller 1200 may include a wireless communication function (e.g., WiFi).

The SSD 1000 according to example embodiments of inventive concepts may adjust the number of page read reclaims dynamically according to degradation information, thereby improving the reliability of data.

Figure 16:
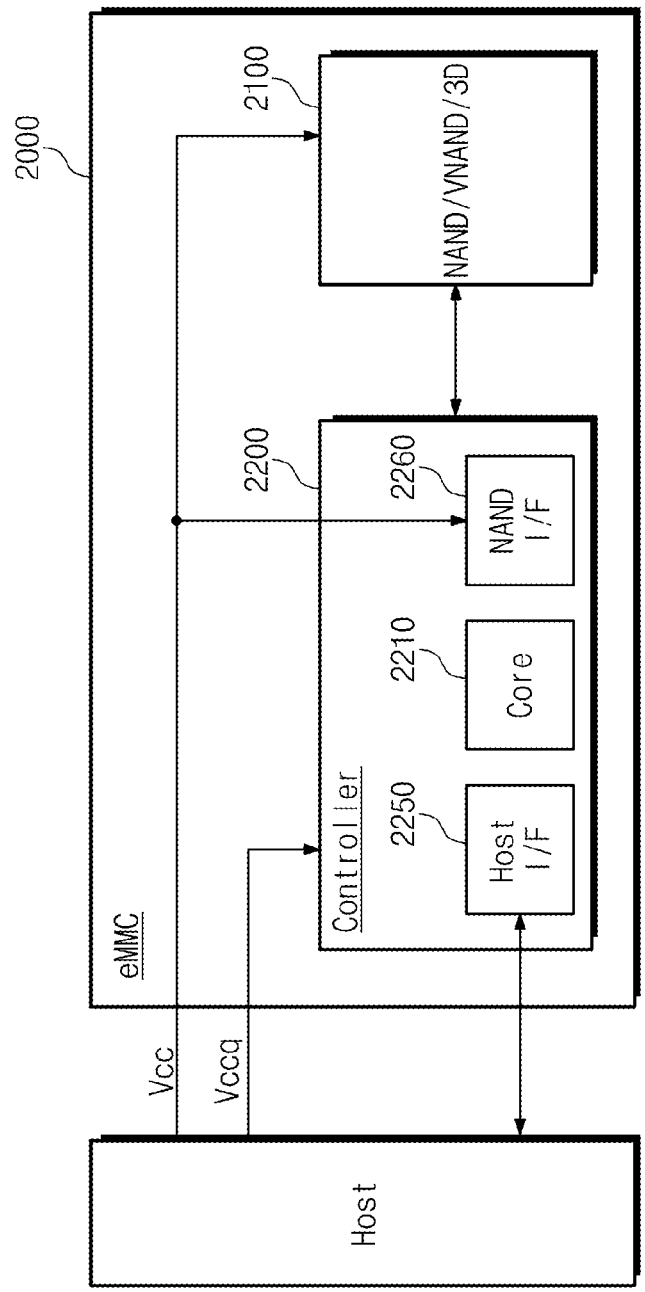
FIG. 16 is a block diagram schematically illustrating an eMMC according to example embodiments of inventive concepts.

Example embodiments of inventive concepts may be used in an eMMC (e.g., an embedded multimedia card, moviNAND, iNAND, etc.). FIG. 16 is a block diagram schematically illustrating an eMMC according to example embodiments of inventive concepts. Referring to FIG. 16, an eMMC 2000 may include one or more NAND flash memory devices 2100 and a controller 2200.

The NAND flash memory device 2100 may be implemented with a nonvolatile memory device 100 described with reference to FIG. 2. The controller 2200 may be connected to the NAND flash memory device 2100 via a plurality of channels. The memory controller 2200 may be implemented with a memory controller 200 described with reference to FIG. 2.

The controller 2200 may include one or more controller cores 2210, a host interface 2250, and a NAND interface 2260. The controller core 2210 may control an overall operation of the eMMC 2000. The host interface 2250 may provide an interface between the controller 2200 and a host. The NAND interface 2260 may provide an interface between the NAND flash memory device 2100 and the controller 2200. In example embodiments, the host interface 2250 may be a parallel interface (e.g., MMC interface). In example embodiments, the host interface 2250 of the eMMC 2000 may be a serial interface (e.g., UHS-II, UFS interface, etc.). As another example, the host interface 2250 may be a NAND interface.

In particular, the controller 2200 may manage a read count by the super block and may perform a reliability verifying operation based on a read count and environment information.

The eMMC 2000 may receive power supply voltages Vcc and Vccq from the host. Herein, the power supply voltage Vcc (e.g., about 3.3 V) may be supplied to the NAND flash memory device 2100 and the NAND interface 2260, and the power supply voltage Vccq (e.g., about 1.8 V/3.3 V) may be supplied to the controller 2200. In example embodiments, the eMMC 2000 may be optionally supplied with an external high voltage.

The eMMC 2000 according to example embodiments of inventive concepts may increase the reliability of data through page read reclaim, thereby lowering error occurrence probability and thus making it possible to perform a high-speed operation.

Figure 17:
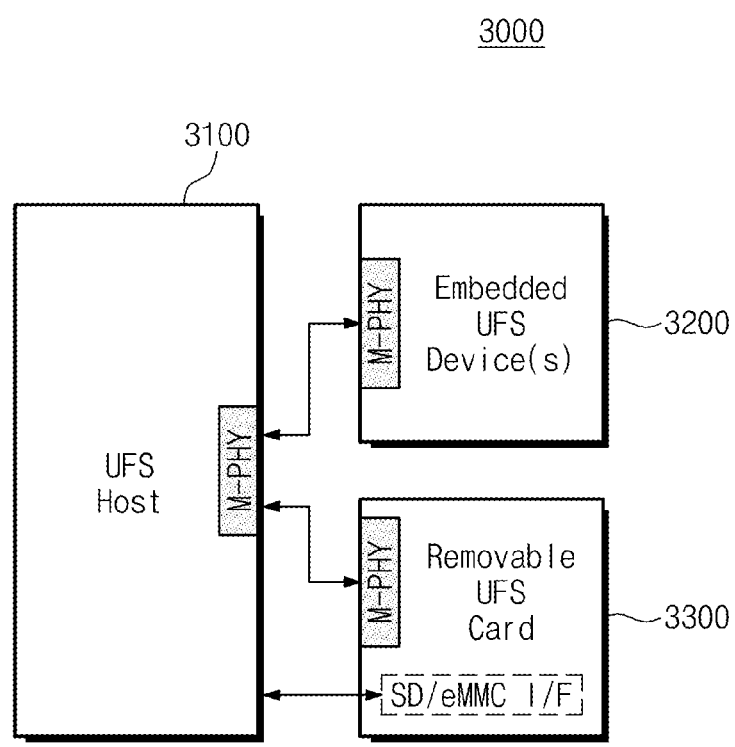
FIG. 17 is a block diagram schematically illustrating a UFS system according to example embodiments of inventive concepts.

Example embodiments of inventive concepts may be applicable to Universal Flash Storage UFS. FIG. 17 is a block diagram schematically illustrating a UFS system according to example embodiments of inventive concepts. Referring to FIG. 17, a UFS system 3000 may include a UFS host 3100, an embedded UFS device 3200, and a removable UFS card 3300. Communication between the UFS host 3100 and the embedded UFS device 3200 and communication between the UFS host 3100 and the removable UFS card 3300 may be performed through M-PHY layers.

At least one of the embedded UFS device 3200 and the removable UFS card 3300 may be implemented with a storage device 10 described with reference to FIG. 2.

Meanwhile, the host 3100 may include a bridge that enables the removable UFS card 3300 to communicate using the protocol different from the UFS protocol. The UFS host 3100 and the removable UFS card 3300 may communicate through various card protocols (e.g., UFDs, MMC, SD (secure digital), mini SD, Micro SD, etc.).

Figure 18:
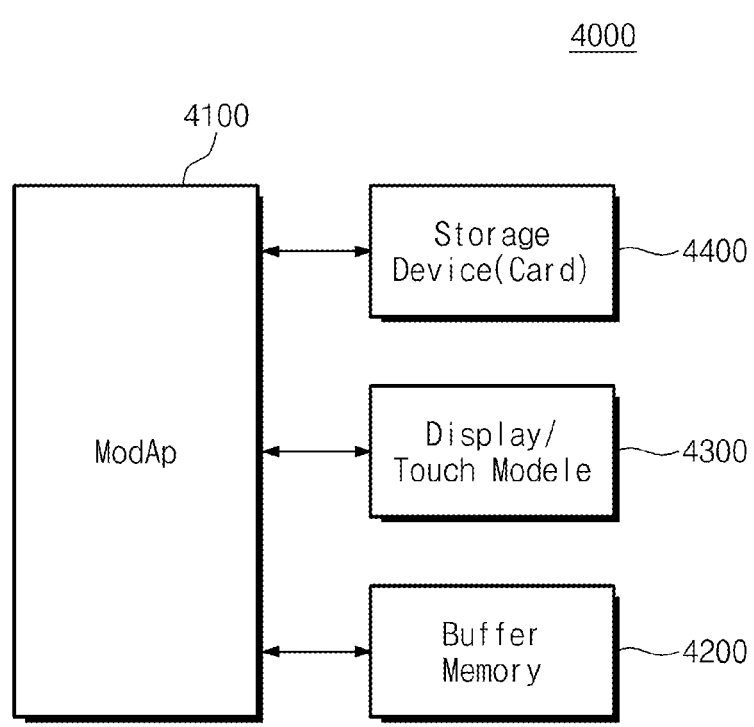
FIG. 18 is a block diagram schematically illustrating a mobile device according to example embodiments of inventive concepts.

Example embodiments of inventive concepts may be applicable to a mobile device. FIG. 18 is a block diagram schematically illustrating a mobile device 4000 according to example embodiments of inventive concepts. Referring to FIG. 18, a mobile device 4000 may include an integrated processor (ModAP) 4100, a buffer memory 4200, a display/touch module 4300, and a storage device 4400.

The integrated processor 4100 may control an overall operation of the mobile device 4000 and wireless/wire communications with an external device. The buffer memory 4200 may store data used to perform a processing operation of the mobile device 4000. The display/touch module 4300 may be implemented to display data processed by the integrated processor 4100 or to receive data through a touch panel. The storage device 4400 may be implemented to store user data. The storage device 4400 may be, but not limited to, a memory card, an eMMC, an SSD, or an UFS device. The storage device 4400 may be configured to manage read reclaim based on degradation information as described with reference to FIGS. 1 to 16.

The mobile device 4000 according to example embodiments of inventive concepts may perform page read reclaim dynamically according to degradation information or endurance information, thereby making it possible optimize the operating performance.

Figure 19:
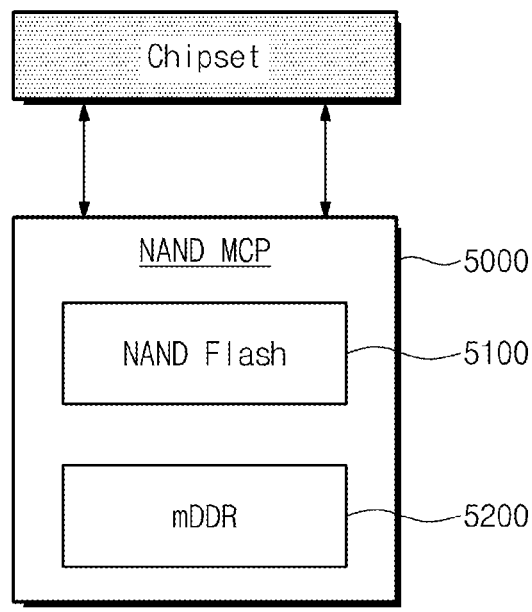
FIG. 19 is a block diagram schematically illustrating a multi-chip page according to example embodiments of inventive concepts.

FIG. 19 is a block diagram schematically illustrating a multi-chip page (NAND MCP) according to example embodiments of inventive concepts. Referring to FIG. 19, NAND MCP 5000 may be a package which includes a NAND flash memory device 5100 and an mDDR (mobile Double Data Rate) memory device 5200. The NAND flash memory device 5100 may be implemented with a nonvolatile memory device 100 shown in FIG. 2. The mDDR memory device 5200 may be a mobile dedicated SDRAM (synchronous dynamic random access memory). A chipset may manage the NAND flash memory device 5100 and the mDDR memory device 5200. In particular, the chipset may dynamically manage read reclaim of the NAND flash memory device 5100 based on degradation information.

Figure 20:
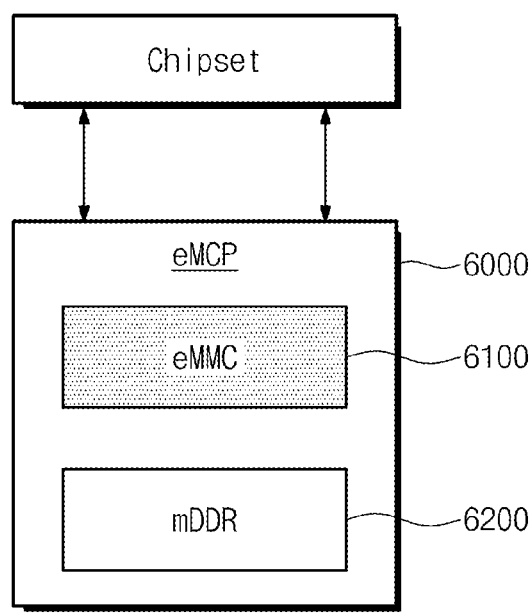
FIG. 20 is a block diagram schematically illustrating an embedded MCP according to example embodiments of inventive concepts.

FIG. 20 is a block diagram schematically illustrating an embedded MCP (eMCP) according to example embodiments of inventive concepts. Referring to FIG. 20, eMCP 6000 may be a package which includes an eMMC 6100 and an mDDR memory device 6200. The eMMC 6100 may be implemented with an eMMC 2000 illustrated in FIG. 16. The mDDR memory device 6200 may be a mobile dedicated SDRAM (synchronous dynamic random access memory). A chipset may manage the eMCP 6000.

Figure 21:
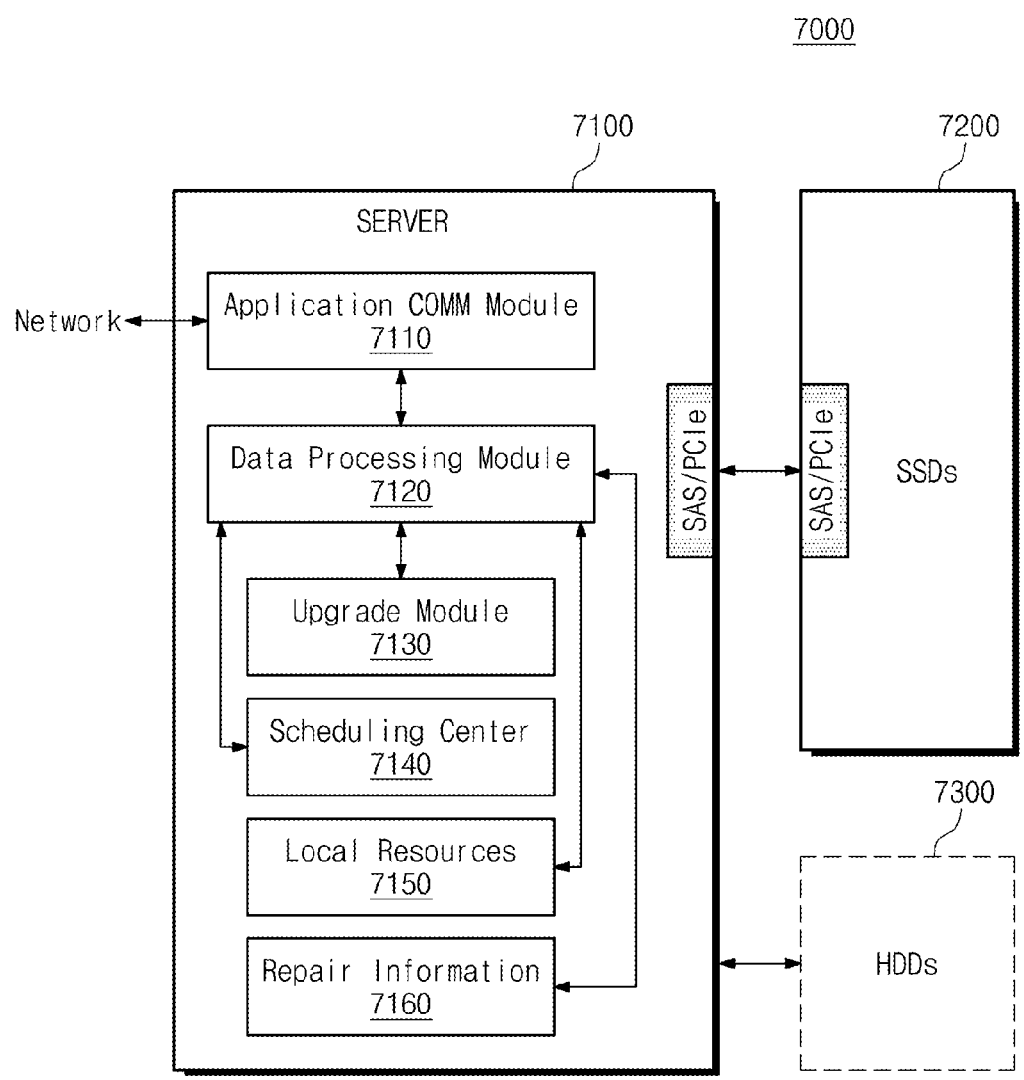
FIG. 21 is a block diagram schematically illustrating a data server system according to example embodiments of inventive concepts.

A storage device according to example embodiments of inventive concepts may be applicable to a data server system. FIG. 21 is a block diagram schematically illustrating a data server system 7000 according to example embodiments of inventive concepts. Referring to FIG. 21, a data server system 7000 may contain a server 7100 and a plurality of solid state drives 7200 for storing data used to drive the server 7100. Here, the solid state drives 7200 may be implemented to have the same configuration as a storage device 10 of FIG. 2 and perform the same operation as the storage device 10.

The server 7100 may contain an application communication module 7110, a data processing module 7120, an upgrade module 7130, a scheduling center 7140, a local resource module 7150, and a repair information module 7160. The application communication module 7110 may be implemented to communicate with a computing system connected with the server 7100 and a network or may allow the server 7100 and the solid state drives 7200 to communicate with each other. The application communication module 7110 may provide the data processing module 7120 with data or information applied through a user interface. The data processing module 7120 may be linked to the local resource module 7150. Here, the local resource module 7150 may provide a user with a list of repair shops/dealers/technical information based on data or information provided to the server 7100.

The upgrade module 7130 may interface with the data processing module 7120. The upgrade module 7130 may perform firmware, reset code, diagnosis system, or other information upgrade about appliances based on data or information sent from the solid state drives 7200. The scheduling center 7140 may permit real-time options to a user based on data or information provided to the server 7100.

The repair information module 7160 may interface with the data processing module 7120. The repair information module 7160 may be used to apply repair-associated information (e.g., an audio, a video, or a document file) to a user. The data processing module 7120 may pack relevant information based on information transmitted from the solid state drives 7200. The packed information may be sent to the solid state drives 7200 or may be displayed to a user.

According to example embodiments, hard disk drives 7300 may be connected to the server 7100 optionally.

The data server system 7000 according to example embodiments of inventive concepts may include a storage device to secure the reliability of a read operation, thereby improving the reliability of data stored at a data server.

A memory system or a storage device according to example embodiments of inventive concepts may be packaged according to any of a variety of different packaging technologies. Examples of such packaging technologies may include the following: PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Meanwhile, the above-described storage devices may be applicable to various mobile devices such as a smart phone, a wearable watch, smart glasses, etc.

As described above, a storage device according to example embodiments of inventive concepts may manage read reclaim based on degradation information, thereby improving the reliability of data.

It should be understood that example embodiments described herein should be considered in a descriptive sense only and not for purposes of limitation. While some example embodiments have been particularly shown and described, it will be understood by one of ordinary skill in the art that variations in form and detail may be made therein without departing from the spirit and scope of the claims.

What is claimed is:

1. A method of operating a storage device by at least one processor, comprising:
   determining a number of page read reclaims based on degradation information in a read operation, the number of page read reclaims being a number of pages to be simultaneously processed at read reclaim; and
   performing a page read reclaim operation in response to a number of pages marked as read reclaim object reaching the number of page read reclaims.

2. The method of claim 1, wherein the degradation information includes a program/erase cycle value.

3. The method of claim 2, wherein the degradation information further includes a program elapsed time information about a page.

4. The method of claim 2, wherein degradation information further includes operation temperature information.

5. The method of claim 1, wherein the determining the number of page read reclaims based on degradation information includes determining the number of page read reclaims based on an amount of written sectors and a terabyte write unit.

6. The method of claim 5, wherein the determining the number of page read reclaims includes obtaining a value using a product of a weight value and a ratio of the amount of written sectors and the terabyte write unit.

7. The method of claim 1, further comprising:
   determining whether read reclaim about a page is required, based on a result of a recovery read operation; and
   marking read reclaim about the page in response to a result of the determining whether the read claim about the page is required indicating the read reclaim is required.

8. A method of operating a storage device, by at least one processor, comprising:
   reading page data in response to a read request;
   determining whether the read page data includes at least one error;
   determining whether the read page data includes an error that is correctable using an error correction circuit (ECC) in response to the read page data including the at least one error;
   performing a recovery read operation in response to the read page data including an error that is uncorrectable using the ECC;
   determining whether the recovery read operation can correct the error that is uncorrectable using the ECC in response to the read page data including the error that is uncorrectable using the ECC;
   determining whether read reclaim is required in response to the recovery read operation can correct the error that is uncorrectable using the ECC;
   marking a relevant page as a read reclaim object in response to the read reclaim is required;
   performing page read reclaim in response to a number of pages marked as read reclaim object reaching a number of page read reclaims, the number of page read reclaims being a number of pages to be simultaneously processed at the read reclaim; and
   changing the number of page read reclaims based on the degradation information.

9. The method of claim 8, wherein determining whether the read page data includes the error that is correctable using the ECC includes determining whether the error is correctable using the ECC, based on a number of errors detected by the ECC.

10. The method of claim 8, wherein the performing the recovery read operation includes
adjusting one of a time and a voltage to perform a read operation according to a recovery read operation table.

11. The method of claim 10, wherein the determining whether read reclaim is required includes:
determining whether read reclaim is required, based on a number of errors detected as a result of a read operation according to the recovery read operation.

12. The method of claim 8, further comprising:
correcting the error that is uncorrectable using the ECC after marking the relevant page in response to read page data including the error that is uncorrectable using the ECC and the error that is uncorrectable using the ECC can be corrected by the recovery read operation.

13. The method of claim 8, wherein
the degradation information includes a program/erase cycle value, and
the number of page read reclaims is changed in response to the program/erase cycle value exceeding a desired value.

14. The method of claim 8, wherein the degradation information includes at least one of a program/erase cycle value, a program elapsed time, and an operation temperature.

15. A method of operating a storage device, by at least one processor, comprising:
determining a reference value using degradation information, the reference value corresponding to a number of pages to be simultaneously processed during a page read reclaim operation;
performing a recovery read operation on one or more pages;
marking a relevant page among the one or more pages as a read reclaim object based on a result of the recovery read operation in response to the relevant page including a correctable error after the recovery read operation; and
performing the read reclaim operation in response to a number of pages marked as read reclaim object among the one or more pages being greater than or equal to the reference value.

16. The method of claim 15, further comprising:
reading data from the relevant page in response to a read request before performing the recovery read operation, the reading data from the relevant page including obtaining read page data from the relevant page;
determining whether the read page data from the relevant page includes at least one of an error of a first type, an error of a second type, and an error of a third type;
the correctable error being the error of the second type, the error of the first type corresponding to errors that cannot be corrected using an error correction circuit (ECC),
the error of the second type corresponding to errors that cannot be corrected using the ECC but can be corrected using the recovery read operation,
the error of the third type corresponding to errors that cannot be corrected using the ECC or recovery read operation; and one of
correcting each error of the second type in the read page data in response to the relevant page including the error of the second type and not including the error of the third type; and
identifying a read failure in response to the relevant page including the error of the third type.

17. The method of claim 15, wherein the recovery read operation includes adjusting one of a time and a voltage to perform a read operation on the relevant page according to a recovery read operation table.

18. The method of claim 15, wherein the determining the reference value using degradation information including obtaining a value using a product of a weight value and a ratio of an amount of written sectors to a terabyte write unit.

19. The method of claim 15, wherein the degradation information a program/erase cycle value.

* * * * *